United States Patent
Hottgenroth

(10) Patent No.: US 6,594,188 B2
(45) Date of Patent: Jul. 15, 2003

(54) INTEGRATED MEMORY HAVING A CELL ARRAY AND CHARGE EQUALIZATION DEVICES, AND METHOD FOR THE ACCELERATED WRITING OF A DATUM TO THE INTEGRATED MEMORY

(75) Inventor: Dirk Hottgenroth, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/015,829

(22) Filed: Dec. 13, 2001

(65) Prior Publication Data

US 2002/0097620 A1 Jul. 25, 2002

(30) Foreign Application Priority Data

Dec. 13, 2000 (DE) .......................................... 100 62 441

(51) Int. Cl.[7] .................................................. G11C 7/00
(52) U.S. Cl. ........................ 365/203; 365/205; 365/149
(58) Field of Search ............................... 365/203, 205, 365/149

(56) References Cited

U.S. PATENT DOCUMENTS 5,754,487 A  5/1998 Kim et al.
6,157,578 A  * 12/2000 Brady .................... 365/189.05

FOREIGN PATENT DOCUMENTS

DE  198 44 479 C1  4/2000

* cited by examiner

Primary Examiner—Huan Hoang
(74) Attorney, Agent, or Firm—Laurence A. Greenberg; Werner H. Stemer; Ralph E. Locher

(57) ABSTRACT

An integrated memory having a memory cell array with addressable column lines and addressable row lines is described. The memory further has a charge equalization device for charge equalization on the column lines, and an amplifier circuit connected to the column lines. A control device drives the charge equalization device after the activation of an addressed row line for writing to a memory cell, so that charge equalization is carried out on an addressed column line. Furthermore, the control device is connected to the amplifier circuits to switch the amplifier circuits on and off. After the activation of the addressed row line, the amplifier circuit on the addressed column line is switched off during a write procedure. Afterward, the charge potential on the addressed column line is equalized by the charge equalization device. Afterward, the amplifier device is switched on for writing the datum to the addressed memory cell.

16 Claims, 2 Drawing Sheets

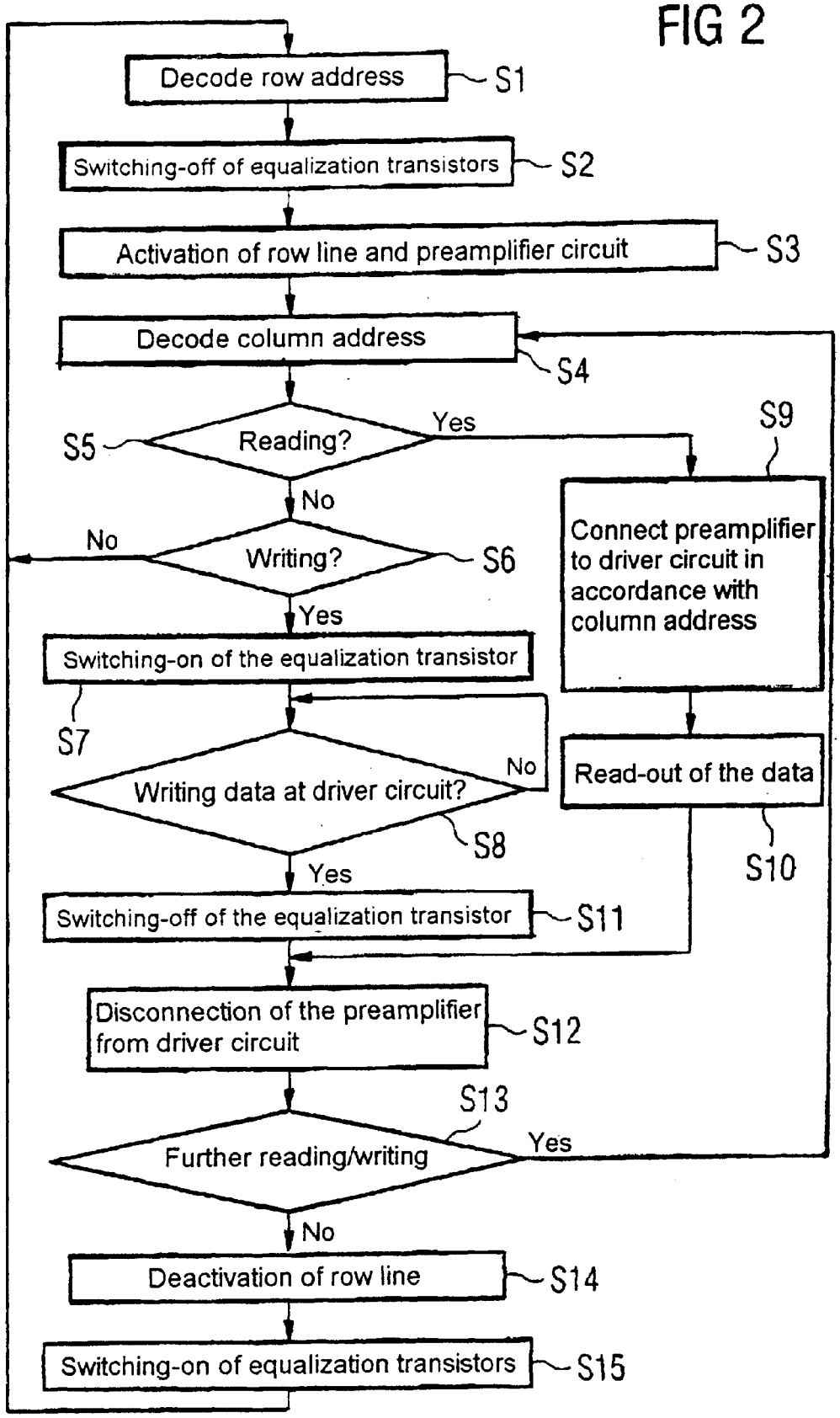

INTEGRATED MEMORY HAVING A CELL ARRAY AND CHARGE EQUALIZATION DEVICES, AND METHOD FOR THE ACCELERATED WRITING OF A DATUM TO THE INTEGRATED MEMORY

BACKGROUND OF THE INVENTION

FIELD OF THE INVENTION

The invention relates to an integrated memory having a cell array with addressable column lines and addressable row lines and a charge equalization device. The invention furthermore relates to a method for writing a datum to a memory cell of the integrated memory having the addressable column lines, the addressable row lines, amplifier circuits and the charge equalization device.

In dynamic memory modules of conventional configurations, write access and read access to the memory differ inter alia in terms of the point in time at which writing and reading data are in each case present on the (external) data lines. In the case of writing, the data are provided on the column lines essentially simultaneously with the write command and the address to which writing is to be effected. In the case of reading, in contrast, a certain time (read latency) is required in order, after the read command, to localize the data in the memory (address decoding), to read out the stored charge, to amplify the signal and to transport it to the data lines. Therefore, when a changeover is made between writing and reading, gaps arise in the data stream to/from the memory, in which gaps no data are present on the data lines.

The gaps in the data stream are usually avoided to the greatest possible extent by artificially delaying the application of the writing data to the data line (write latency). This is carried out in order e.g. still to be able to read data of a previous read command on the data lines while a write command is already been sent. Thus, the write latency is also provided in addition to the read latency.

The write latency and the read latency are preferably approximately of the same length in order to ensure a continuous data stream from and to the memory. Since, during the read-out of the data, the data lines are enabled again only after the read latency time has elapsed, the data lines cannot be occupied with writing data until at this point in time. However, since the transporting of the writing data from the data lines to the memory cells and also the charge reversal of the column line entail a time delay, a gap arises in the data stream on the external data lines.

SUMMARY OF THE INVENTION

It is accordingly an object of the invention to provide an integrated memory having a cell array and charge equalization devices, and a method for the accelerated writing of a datum to the integrated memory that overcome the above-mentioned disadvantages of the prior art methods and devices of this general type.

With the foregoing and other objects in view there is provided, in accordance with the invention, a method for writing a datum to a memory cell of a memory cell array having addressable column lines, addressable row lines, amplifier circuits connected to the addressable column lines, and a charge equalization device for charge equalization of the addressable column lines. The method includes the steps of activating an addressed row line; switching-off an amplifier circuit on an addressed column line; equalizing a charge potential on the addressed column line using the charge equalization device; and switching-on the amplifier device for the addressed column line to write the datum to an addressed memory cell.

The invention is based on the fact that the writing of the datum to the dynamic memory cell via the column line proceeds more rapidly if the column line and the storage capacitance situated thereon are at a potential between the respective voltage potentials for the high state and the low state. This makes it possible to reduce the time for charge reversal of the relevant column line and of the relevant storage capacitance. Thus, e.g. a charge reversal from a high voltage potential to a low voltage potential, which corresponds e.g. to a change in the datum present on the column line from a high state to a low state, requires more time than a charge reversal of the column line from an intermediate medium voltage potential to a high or low voltage potential.

Since the longest charge reversal time which can occur during the write operation always determines the total writing time, the time delay in the case of writing is defined by a charge reversal of a data line from a high to a low state, or vice versa.

The potential lying between the high and low potentials is obtained with the aid of the charge equalization device which, in accordance with a control signal, short-circuits one of the column lines with a charge equalization element, so that the charges situated there are equalized. The charge equalization element used is preferably a further column line, particularly preferably an adjacent column line, which is not connected to the addressed row line via a memory cell.

The charge differences on the column lines arise because the charges situated on the adjacent column lines have been differentially expanded beforehand by a preamplifier circuit. In this case, the column line on which the memory cell to be read is situated is pulled to a potential which corresponds to the content of the memory cell, high charge level for a stored logic "1" or low charge level for a stored logic "0". The column line adjacent thereto is pulled to another potential, which corresponds to the inverted content of the memory cell to be read. What is advantageously achieved by the equalization of the charge by the charge equalization devices immediately prior to a write operation is that less charge has to be subjected to charge reversal in the case of writing to a memory cell, and the time required for this is thereby reduced.

In the case of conventional memories, it has hitherto been customary to provide charge equalization devices between adjacent column lines, which are driven jointly if none of the row lines is addressed. This is necessary in order to pull the adjacent column lines to the same potential before a read operation in order that, during subsequent renewed reading, the small charge differences which arise as a result of the charge of a storage capacitor being switched onto the respective column line can be detected by the preamplifier circuit.

According to the invention, the charge equalization devices that are customary in conventional memories are controlled by a control device. During the write latency time, the memory cells that are to be written to are already addressed by the row lines. Activation of all the charge equalization devices would then result in that all the memory cells situated on the activated row lines would be erased without new contents subsequently being written to all the erased memory cells.

This is now avoided according to the invention in that the charge equalization devices are driven separately. In this way, only the storage capacitor and the column lines whose associated memory cell is intended to be written to are provided with an equalized potential.

Furthermore, it may advantageously be provided that, after a write operation, the row lines are deactivated and then all the charge equalization devices situated on the column lines are activated, so that the voltage potentials on all the column lines are equalized with their adjacent column lines in each case. In this way, the column lines are prepared for a subsequent read operation, and it is possible to avoid the situation in which the charge situated on the column lines conceals the charge to be read from the memory cells, so that the latter charge can no longer be reliably detected. The respectively adjacent column lines are connected to an amplifier circuit which amplifies the small charge differences which occur after a process of reading from a storage capacitor onto the column lines, so that the charge differences can be identified by a down stream logic unit.

In accordance with an added mode of the invention, there is the step of equalizing a charge potential on one of the column lines with a charge potential on another of the column lines.

In accordance with an additional mode of the invention, there is the step of carrying out the equalizing of the charge potential on the addressed column line with a charge potential of the charge equalization device during a write latency time.

In accordance with another mode of the invention, during the step of charge equalization on the addressed column line by the charge equalization device, the column lines acquire a common charge potential lying approximately in a middle between a voltage level for a low state and a voltage level for a high state.

In accordance with a further mode of the invention, during the equalizing of the charge potential on one of the column lines with the charge potential on another of the column lines, using adjacent column lines which are not connected to the addressed row line via the memory cell.

With the foregoing and other objects in view there is provided, in accordance with the invention, an integrated memory. The memory contains a memory cell array having addressable column lines, addressable row lines, and memory cells connected to the addressable column lines and the addressable row lines. A charge equalization device is connected to and charge equalizes the addressable column lines. Amplifier circuits are connected to the addressable column lines for writing to the memory cells. A control device is connected to the charge equalization device, the control device drives the charge equalization device after an activation of an addressed row line for writing to a memory cell for carrying out charge equalization on an addressed column line.

In accordance with an added feature of the invention, the control device is connected to the amplifier circuits for switching the amplifier circuits on and off.

In accordance with an additional feature of the invention, a switching device is connected to the amplifier circuits, and a driver circuit is connected to the switching device and to the amplifier circuits through the switching device for connecting the amplifier circuits alternately to the driver circuit.

In accordance with a further feature of the invention, the charge equalization device includes one of the addressable column lines.

In accordance with another feature of the invention, the charge equalization device has a charge equalization element. The charge equalization element has a transistor and the charge equalization element connects two of the addressable column lines to one another.

In accordance with a further added feature of the invention, the two of the addressable column lines connected to the charge equalization element are adjacent to each other.

In accordance with further additional feature of the invention, on each of the addressable row lines, the memory cells are in each case disposed only on one of the two addressable column lines.

In accordance with a concomitant feature of the invention, each of the addressable column lines has a charge capacitance and a charge capacitance of the equalization device is substantially equivalent to the charge capacitance of the addressable column lines.

Other features which are considered as characteristic for the invention are set forth in the appended claims.

Although the invention is illustrated and described herein as embodied in an integrated memory having a cell array and charge equalization devices, and a method for the accelerated writing of a datum to the integrated memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a flow chart of an exemplary embodiment of the method according to the invention.

DESCRIPTION OF THE PREFERRED EMBODIMENTS

Figure 1:
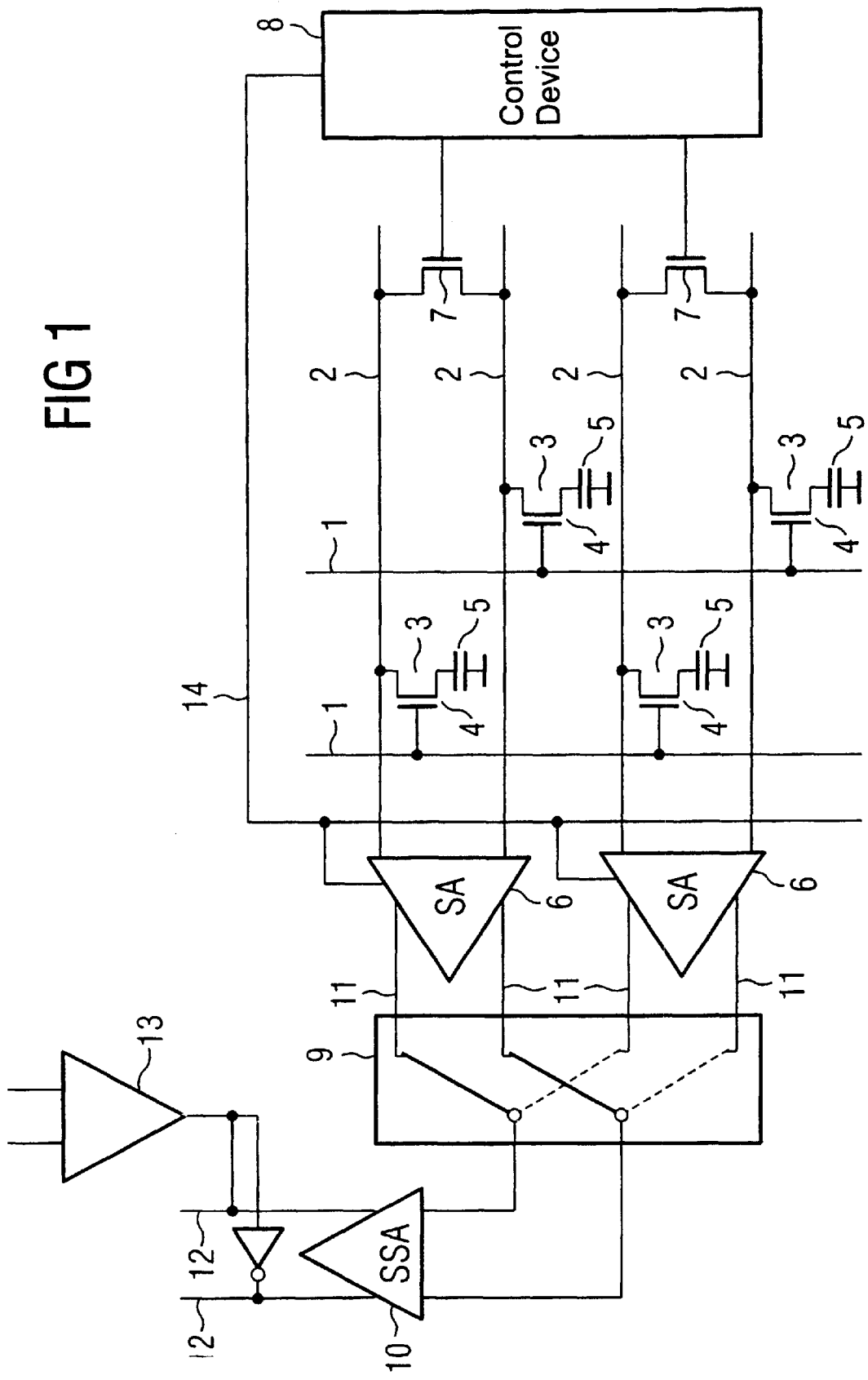
FIG. 1 is a block diagram of an integrated memory according to the invention.

Referring now to the figures of the drawing in detail and first, particularly, to FIG. 1 thereof, there is shown a block diagram of an integrated memory having row lines 1 and column lines 2. Each row line 1 has memory cells 3 at crossover points with every second column line 2, the memory cells 3 each contain a memory transistor 4 and a storage capacitor 5. This is necessary in order that, during the addressing of the memory cell 3 by the row line 1, two memory cells 3 on two mutually adjacent column lines are not addressed simultaneously. In the case of the row line 1 adjacent thereto, the memory cells 3 are disposed in an offset manner on the column lines 2, so that it is also the case that each column line 2 has the memory cells 3 only at the crossover points with every second row line 1. In the case of reading from one of the memory cells 3, the latter is addressed via the relevant row line 1 by the memory transistor 4 being opened, so that the charge stored in the memory transistor 5 brings about a charge change on the column line 2.

A preamplifier circuit 6 is connected to in each case two adjacent column lines 2, which preamplifier circuit 6 amplifies a potential difference on the adjacent column lines and pulls the adjacent column lines to different voltage potentials and increases the potential difference. The sign of the difference potential between the adjacent column lines 2 is assigned to a specific datum stored in the memory cell 3. To ensure, however, that the content of the memory cell 3 can be read, the voltage potentials of the adjacent column lines 2 must be identical before the opening of the memory transistor 4, i.e. before the activation of the row line 1. This is achieved by virtue of the fact that all the row lines 1 are deactivated in each case after the conclusion of a write operation or a read operation from one or more memory cells 3 of a row line 1, and that equalization transistors 7 connected to the adjacent column lines 2 in parallel with the preamplifiers 6 are switched to the on state, so that the charges are equalized in each case on the adjacent column lines 2. If data are intended to be read out successively from a plurality of the memory cells 3 of the row line 1, then the row line 1 is first deactivated and the charge equalization is carried out when all the relevant memory cells 3 have been read.

The equalization transistors 7 are connected to a control device 8 which switches the equalization transistors 7 to the on state after each write or read operation and after the deactivation of all the row lines 1, in order thus to put the column lines 2 at the same potential with regard to their adjacent column lines. The preamplifier circuits 6 are likewise connected to the control device 8 via a switching line 14, so that the preamplifier circuits 6 can be switched off when the equalization transistors 7 are switched on.

The preamplifier circuits 6 are connected via the lines 11 to a demultiplexer circuit 9, which, depending on the address to be read or written, connects the preamplifier circuit 6 on the addressed column line 2 to a driver circuit 10. To that end, the difference signal—generated by the preamplifier circuit 6—on the adjacent column lines 2 is likewise output on the lines 11. The lines 11 are connected to the driver circuit 10 in the case of addressing. In the driver circuit 10, the difference signals are amplified further and are then available on data lines 12 for reading. The preamplifier circuit 6 and the driver circuit 10 preferably operate bi-directionally, i.e. data can be applied to the data line 12 via a writing driver 13 and be fed via the driver circuit 10 to the preamplifier circuit 6 addressed by the demultiplexer circuit 9.

The preamplifier circuits 6 operate in such a way that they amplify a small charge difference between the respectively adjacent column lines. Proceeding from an initially identical quantity of charge on the connected adjacent column lines 2, one of the adjacent column lines 2 has switched onto it the quantity of charge of the storage capacitor 5 (connected thereto) via the memory transistor 4. The potential difference is amplified by the preamplifier circuit 6 pulling the lower potential of the two adjacent column lines 2 to a defined low potential level and the higher potential to a defined higher potential level. A voltage difference that is positive or negative in accordance with the stored datum is thus generated on the column lines 2 and the lines 11.

As described above, the equalization transistor 7, which must be activated before every process of reading data, in order to equalize the charges on the column lines 2, is an essential element for the functioning of the preamplifier circuit 6. To ensure that no memory cell 3 is erased, the row lines 1 must not be activated in this case. In the case of writing, the equalization transistors 7 are switched off and the addressed row line 1 is switched on, so that the charge of the memory transistor 5 flows onto the initially equalized voltage potential on adjacent column lines. When the equalization transistor 7 connected to the addressed memory cell 3 is switched on, the charges in the storage capacitor 5, the addressed memory cell 3 and the relevant column lines 2 are equalized. As a result, the memory cell 3 is erased.

The method according to the invention is illustrated in FIG. 2 in the form of a flow diagram. In step S1, the row address is decoded in a non-illustrated address decoder and the corresponding addressed row line 1 is activated after the equalization transistors 7 have been switched off (step S2). Equally, the preamplifier circuits 6 are switched on by the control device 8 and the switching line 14, with the result that the preamplifier circuits 6 detect and amplify the charge difference on the column lines 2 (step S3). It is expedient for the equalization transistors 7 not to be switched off until shortly before the activation of the row line 1 and the associated opening of the memory transistor 4. The negative influence of parasitic charge currents from and to the column lines 2 can be reduced in this way.

Next, the column addresses are decoded (step S4). If the intention is to effect reading from the addressed memory cell (step S5), the demultiplexer 9 is switched in accordance with the decoded column address, as a result of which the preamplifier circuit 6 on the addressed column line 2 is connected to the driver circuit 10 (step S9). The content of the addressed memory cell 3 is then present on the data lines 12. After the reading of the data (step S10), the preamplifier circuit 6 is disconnected from the driver circuit 10 by the demultiplexer device 9 (step S11).

If the intention is to effect writing to the addressed memory cell 3 (step S6), the equalization transistor 7 between the column line 2 on which the addressed memory cell is situated and the column line 2 adjacent thereto is switched on (step S7), with the result that the charge potential is equalized on the adjacent column lines 2 and in the storage capacitor 5 addressed by the previously activated row line 1. The memory transistor 4 of the addressed memory cell 3 is switched to the on state by the activated row line 1, so that the charge in the storage capacitor 5 flows away onto the relevant column line 2. In this way, the content of the memory cell 3 is erased immediately before writing thereto.

The equalization transistor 7 on the addressed column line 2 preferably remains switched on until the writing data are present at the driver circuit 10 (step S8). If the writing data are present at the driver circuit 10, they are transmitted via the line 11 to the preamplifier circuit 6 and, at the same time as this or in temporal proximity thereto, the equalization transistor 7 is switched off (step S11) and the preamplifier circuit 6 is switched on via the switching line 14 by the control device 8, so that the writing data present on the data line 12 are applied to the addressed column line 2 via the driver device 10, the demultiplexer device 9 and the preamplifier circuit 6. As a result, the storage capacitor 5 is provided with the quantity of charge that corresponds to the datum to be written.

After the datum has been written to the addressed memory cell 3 or after—in accordance with steps S9 and S10—the datum has been read from the addressed memory cell 3, the preamplifier circuit 6 is disconnected from the driver circuit 10 by the demultiplexer 9 (step S12). If the intention now, in accordance with step S13, is to read from or write to further memory cells 3 which are situated on the addressed row line 1, then a jump is made back to step S4, in which the next column address is decoded. Only when no further reading from or writing to memory cells 3 of the same row line 1, which is still activated, is to be effected is the row line deactivated in step S14. During the sequence, the preamplifier circuit 6 remains activated until the row line 1 is deactivated, as a result of which the memory transistors 4 are switched off and, consequently, the storage datum previously written or read is stored in the form of a quantity of charge in the storage capacitor 5 (step S13).

After the end of a write operation or of a read operation, all the equalization transistors 7 are switched on by the control device 8 with the row lines 1 deactivated, so that the charge potentials on the respectively adjacent column lines 2 are equalized with respect to one another (step S15). In this way, the column lines 2 are prepared for a subsequent read operation for which identical voltage potentials are required on the column lines that are respectively adjacent to one another.

The preamplifier circuit 6 is constructed in such a way that it amplifies the charge difference on the adjacent column lines 2 and outputs it onto the lines 11. Consequently, the preamplifier circuit 6 also has the effect that the potential difference on the adjacent column lines 2 is increased as soon as a small charge difference is identified. When the row line 1 is activated, the charges of the storage capacitors 5 from all the memory cells 3 situated thereon flow onto the respective column line 2. As a result, the content of the respective memory cell 3 is lost. By use of the preamplifier circuit 6, however, the content of the memory cell 3 is written back to the storage capacitor 5 again, with the result that the storage datum read is not lost.

The advantage of the method according to the invention becomes clear if we consider the state of the column lines immediately before the writing of the data by the preamplifier circuit 6. Upon the activation of the row line 1 with the addressed memory cell 3, all the memory transistors situated on the row line 1 are switched to the on state, so that the charge on the storage capacitors 5 is discharged onto the respective column line 2. As described above, the preamplifier circuit 6 is embodied in such a way that it then amplifies the potential difference on the column lines 2 and, in this way, writes the charge back to the storage capacitors 5. If a datum is to be written to the addressed memory cell 3, then, in the unfavorable case, the entire charge difference must be subjected to charge reversal from a high or low charge potential on the column line 2 and in the storage capacitor 5 of the addressed memory cell 3 to a low or high charge potential. This requires a charge reversal time.

According to the invention, prior to the process of writing to the addressed memory cell 3, the column line 2 on which the addressed memory cell 3 is situated and the column line 2 adjacent thereto are short-circuited by the corresponding equalization transistor 7 and the charge potentials are thereby equalized. The preamplifier circuit 6 then receives the same voltage potential on both column lines 2. As a result, the preamplifier circuit 6 leaves the voltage potential for the column lines 2 unchanged at the voltage potential, with the result that the voltage potentials of both column lines 2 remain approximately at a voltage level lying in the middle between the high potential and the low potential. The writing datum arriving via the line 11 can then be written to the addressed memory cell. This merely requires that the column line 2 be pulled from the medium voltage potential to a high or low voltage potential. This considerably reduces the charge reversal time since, in this way, only about half of the voltage swing has to be subjected to charge reversal by the preamplifier circuit 6.

It is particularly advantageous if there are separate driver circuits and lines between the preamplifier circuit 6 and the driver circuit 10 for a read operation and a write operation. This makes it possible, after the closing of the connection between the preamplifier circuit 6 and the driver circuit 10, to continue to keep the reading driver circuit active and to transport the charge in the direction of the data line, while the writing driver circuit waits for the writing data and then establishes the connection to the preamplifier circuit 6.

The advantage is significant particularly when the column address is decoded distinctly before the presence of the writing data, so that sufficient time remains for the equalization of the voltage potentials. This is expedient particularly in the case of memories with an envisaged write latency. In the case of memories without write latency, the level to be written can be applied immediately after the column decoding, as a result of which a previous equalization of the voltage potentials affords a more modest advantage.

The features of the invention which are disclosed in the above description, the claims and the drawings may be essential to the realization of the invention in its different configurations both individually and in any desired combination.

I claim:

1. A method for writing a datum to a memory cell of a memory cell array having addressable column lines, addressable row lines, amplifier circuits connected to the addressable column lines, and a charge equalization device for charge equalization of the addressable column lines, which comprises the steps of:

activating an addressed row line;

switching-off an amplifier circuit on an addressed column line;

equalizing a charge potential only on the addressed column line using the charge equalization device; and switching-on the amplifier device for the addressed column line to write the datum to an addressed memory cell.

2. The method according to claim 1, which comprises deactivating the addressed row line after the datum has been written to the addressed memory cell; and equalizing charge potentials of the column lines with a respective charge potential of the charge equalization device.

3. The method according to claim 2, which comprises equalizing a charge potential on one of the column lines with a charge potential on another of the column lines.

4. The method according to claim 1, which comprises carrying out the equalizing of the charge potential on the addressed column line with a charge potential of the charge equalization device during a write latency time.

5. The method according to claim 1, which comprises during the step of charge equalization on the addressed column line by the charge equalization device, the column lines acquire a common charge potential lying approximately in a middle between a voltage level for a low state and a voltage level for a high state.

6. The method according to claim 3, which comprises during the equalizing of the charge potential on one of the column lines with the charge potential on another of the column lines, using adjacent column lines which are not connected to the addressed row line via the memory cell.

7. An integrated memory, comprising:

a memory cell array having addressable column lines, addressable row lines, and memory cells connected to said addressable column lines and said addressable row lines;

a charge equalization device connected to and charge equalizing said addressable column lines;

amplifier circuits connected to said addressable column lines for writing to said memory cells; and a control device connected to said charge equalization device, said control device driving said charge equalization device after an activation of an addressed row line for writing to a memory cell for carrying out charge equalization only on an addressed column line.

8. The integrated memory according to claim 7, wherein said control device is connected to said amplifier circuits for switching said amplifier circuits on and off.

9. The integrated memory according to claim 7, including:
a switching device connected to said amplifier circuits; and
a driver circuit connected to said switching device and to said amplifier circuits through said switching device for connecting said amplifier circuits alternately to said driver circuit.

10. The integrated memory according to claim 7, wherein said charge equalization device includes one of said addressable column lines.

11. The integrated memory according to claim 7, wherein said charge equalization device has a charge equalization element.

12. The integrated memory according to claim 11, wherein said charge equalization element has a transistor.

13. The integrated memory according to claim 11, wherein said charge equalization element connects two of said addressable column lines to one another.

14. The integrated memory according to claim 13, wherein said two of said addressable column lines connected to said charge equalization element are adjacent to each other.

15. The integrated memory according to claim 14, wherein on each of said addressable row lines, said memory cells are in each case disposed only on one of said two addressable column lines.

16. The integrated memory according to claim 7, wherein each of said addressable column lines has a charge capacitance and a charge capacitance of said equalization device is substantially equivalent to said charge capacitance of said addressable column lines.

* * * * *

UNITED STATES PATENT AND TRADEMARK OFFICE
CERTIFICATE OF CORRECTION

PATENT NO.    : 6,594,188 B2
DATED         : July 15, 2003
INVENTOR(S)   : Dirk Hottgenroth It is certified that error appears in the above-identified patent and that said Letters Patent is hereby corrected as shown below:

<u>Title page,</u>
Item [30], should read as follows:

-- Foreign Application Priority Data

Dec. 13, 2000    (DE) ……………. 100 62 110 --

Signed and Sealed this

Fourth Day of November, 2003

JAMES E. ROGAN
*Director of the United States Patent and Trademark Office*